US010422028B2

(12) United States Patent
Huang et al.

(10) Patent No.: US 10,422,028 B2
(45) Date of Patent: Sep. 24, 2019

(54) SURFACE COATING TREATMENT

(71) Applicant: Lam Research Corporation, Fremont, CA (US)

(72) Inventors: Lihua Li Huang, Pleasanton, CA (US); Hong Shih, Santa Clara, CA (US); Siwen Li, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/961,707

(22) Filed: Dec. 7, 2015

(65) Prior Publication Data

US 2017/0159164 A1   Jun. 8, 2017

(51) Int. Cl.
| | | |
|---|---|---|
| C23C 4/18 | (2006.01) | |
| C23C 4/04 | (2006.01) | |
| C23C 4/11 | (2016.01) | |
| C23C 16/44 | (2006.01) | |

(52) U.S. Cl.
CPC ............. *C23C 4/18* (2013.01); *C23C 4/04* (2013.01); *C23C 4/11* (2016.01); *C23C 16/4404* (2013.01)

(58) Field of Classification Search
CPC .... C23C 4/04; C23C 4/18; C23C 4/11; B23K 26/0066; B23K 26/0081; B23K 26/0084; B23K 26/60
USPC .................. 427/554–556, 446, 453–454
See application file for complete search history.

(56) References Cited

U.S. PATENT DOCUMENTS

| | | | | |
|---|---|---|---|---|
| 5,072,092 A | | 12/1991 | Richter et al. | |
| 5,362,523 A | * | 11/1994 | Gorynin | C23C 4/02 427/446 |
| 5,391,841 A | * | 2/1995 | Quick | H01L 21/4807 174/258 |
| 6,777,045 B2 | * | 8/2004 | Lin | H01J 37/32458 118/723 R |
| 2007/0218302 A1 | * | 9/2007 | Kobayashi | C23C 4/02 428/469 |
| 2011/0017659 A1 | * | 1/2011 | Aktas | C23C 16/403 210/500.1 |
| 2014/0302247 A1 | * | 10/2014 | Inaba | C23C 4/10 427/493 |
| 2015/0152540 A1 | * | 6/2015 | Sato | H01J 37/32477 428/148 |

FOREIGN PATENT DOCUMENTS

| | | |
|---|---|---|
| CN | 1522457 | 8/2004 |
| CN | 101074473 | 11/2007 |
| CN | 103890223 A | 6/2014 |
| WO | WO-2013176168 A1 * 11/2013 | ........ H01J 37/32477 |

OTHER PUBLICATIONS

Paschotta, Rudiger. Excimer Lasers. n.d. https://www.rp-photonics.com/excimer_lasers.html.*

(Continued)

*Primary Examiner* — Jose Hernandez-Diaz
(74) *Attorney, Agent, or Firm* — Beyer Law Group LLP

(57) ABSTRACT

A method for conditioning a ceramic layer with a thickness of less than 150 μm over a substrate is provided. The ceramic layer is cleaned. A region of the ceramic layer is scanned with a pulsed excimer laser beam at a repetition rate of 3-300 Hz.

11 Claims, 4 Drawing Sheets

(56) References Cited

OTHER PUBLICATIONS

Paschotta, Rudiger. Excimer Lasers. n.d. https://www.rp-photonics.com/excimer_lasers.html (cached May 10, 2013) (Year: 2013).*
Pawlowski L., "Thick Laser Coatings: A Review", Journal of Thermal Spray Technology, vol. 8 (2), Jun. 1999, 279-295.
Chinese Office Action from Chinese Application No. 201610976836.4 dated Apr. 10, 2018.
Chinese Office Action from Chinese Application No. 201610976836.4 dated Nov. 19, 2018.

* cited by examiner

SURFACE COATING TREATMENT

BACKGROUND OF THE INVENTION

The present invention relates to the manufacturing of semiconductor devices. More specifically, the invention relates to coating chamber surfaces used in manufacturing semiconductor devices.

During semiconductor wafer processing, plasma processing chambers are used to process semiconductor devices. Coatings are used to protect chamber surfaces.

SUMMARY OF THE INVENTION

To achieve the foregoing and in accordance with the purpose of the present invention, a method for conditioning a ceramic layer with a thickness of less than 150 µm over a substrate is provided. The ceramic layer is cleaned. A region of the ceramic layer is scanned with a pulsed excimer laser beam at a repetition rate of 3-300 Hz.

In another manifestation, a method for conditioning a ceramic layer comprising at least one of a fluoride, oxyfluoride, or oxide containing Lanthanide series group III or group IV elements with a thickness of less than 150 µm over a substrate is provided. The ceramic layer is cleaned. The cleaning the ceramic layer, comprises, rinsing the ceramic layer, applying ultrasonic energy to the ceramic layer, and drying the ceramic layer. A region of the ceramic layer is scanned with a pulsed excimer laser beam at a repetition rate of 3-300 Hz and at a wavelength between 157 nm and 351 nm with an energy density of 200 to 8000 mJ/cm$^2$, wherein each point in the region of the ceramic layer is treated with 10 to 500 laser shots, wherein the pulsed excimer laser beam provides localized heating of the ceramic layer to a temperature that cause the ceramic layer to melt without damaging or delaminating from the substrate, wherein the melting the ceramic layer reduces loose particles and porosity of the ceramic layer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
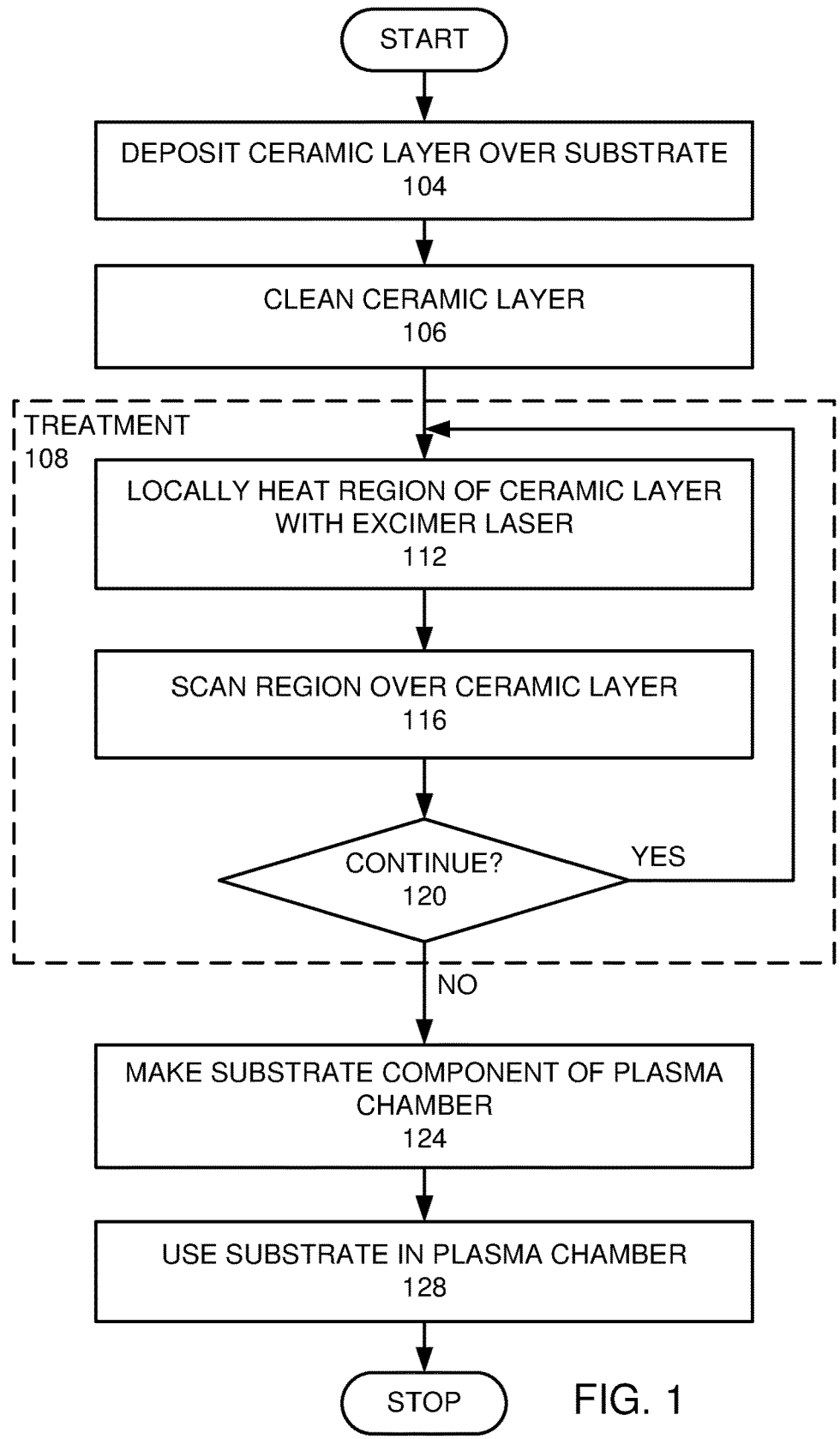
FIG. 1 is a high level flow chart of an embodiment of the invention.

To facilitate understanding, FIG. 1 is a high level flow chart of a process used in an embodiment of the invention. A ceramic layer is deposited over a substrate, where the ceramic layer has a porosity (step 104). The ceramic layer is cleaned (step 106). The ceramic layer is subjected to a treatment process (step 108). The treatment process (step 108) comprises the steps of providing localized heating of a region of the ceramic layer by a pulsed excimer laser to a temperature that causes the ceramic layer to melt without damaging the substrate (step 112) and scanning the region of the ceramic layer heated by the localized heating over the ceramic layer (step 116). A determination is made on whether to repeat the process (step 120). If the process is to be repeated, the porosity reduction process is repeated (step 108). If the process is not further repeated, then the substrate is made a component in a plasma processing chamber (step 124), such as a liner, a window, and injector, an edge ring, or a covering of another chamber component, or by using the substrate as an electrode. The substrate is then used in the plasma processing chamber (step 128).

EXAMPLES

Figure 2A:
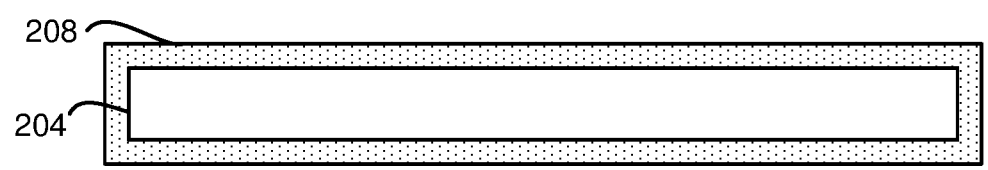
FIGS. 2A-B are schematic views of a substrate processed according to an embodiment of the invention.

In an example of a preferred embodiment of the invention, a ceramic layer is deposited over a substrate (step 104). FIG. 2A is a schematic cross-sectional view of a substrate 204 with a ceramic layer 208 over the substrate 204. The ceramic layer 208 has a porosity, which is indicated by the shading. In this embodiment, the ceramic layer 208 is deposited by a thermal spray deposition. In other embodiments, the ceramic layer may be deposited by plasma spray, suspension spray, PVD (plasma vapor deposition), CVD (chemical vapor deposition), or aerosol deposition. In this embodiment the substrate is anodized aluminum. In other embodiments, the substrate is alumina, silicon carbide, aluminum, yttria or AN. In this embodiment, the ceramic layer 208 comprises yttrium oxide (yttria). In other embodiments, the ceramic layer 208 comprises at least one of a fluoride, oxyfluoride, or oxide containing Lanthanide series group III or group IV elements, or other combinations of ceramic coatings. Preferably the ceramic coating comprises at least one of yttrium oxide, yttrium fluoride, yttrium oxyfluoride, or yttria stabilized zirconia.

Thermal spraying is a general term used to describe a variety of coating processes, such as plasma spraying, arc spraying, flame/combustion spraying, and suspension spraying. All thermal spraying uses energy to heat a solid to a molten or plasticized state. The molten or plasticized material is accelerated towards the substrate so that the molten or plasticized material coat the surface of the substrate and cool. Preferably, plasma spraying is used to provide the yttria coating. These processes are distinct from vapor deposition processes, which use vaporized material instead of molten material. In this embodiment, the thickness of the ceramic coating is less than 150 µm.

The ceramic layer is cleaned (step 106). In this embodiment, the cleaning first comprises a deionized water rinse of the surface of the ceramic layer. The surface of the ceramic layer is then subjected to an ultrasonic cleaning, which may use ultrasonic shaking. The ceramic layer is then heated to 100° C. to dry the surface of the ceramic layer.

The ceramic layer is subjected to a treatment process (step 108). In this process, localized heating of a region of the ceramic layer 208 by a pulsed excimer laser to a temperature that causes the ceramic layer to melt without damaging the substrate is provided (step 112) to heat the localized region to a temperature that melts the ceramic coating layer at the localized region without damaging the substrate 204. The energy is primarily dissipated in the top 50 μm or less of the ceramic coating, so that material more than 50 μm from the surface is not melted. More preferably material that is more than 30 μm from the surface is not melted. This requires selection of an energy source that is absorbed by the ceramic coating layer. In this embodiment, the melting of the ceramic layer reduces porosity. The melting of the ceramic may also include remelting of the ceramic with multiple exposures and varying energy levels to achieve the desired material properties (i.e. melt depth and surface finish).

Figure 3:
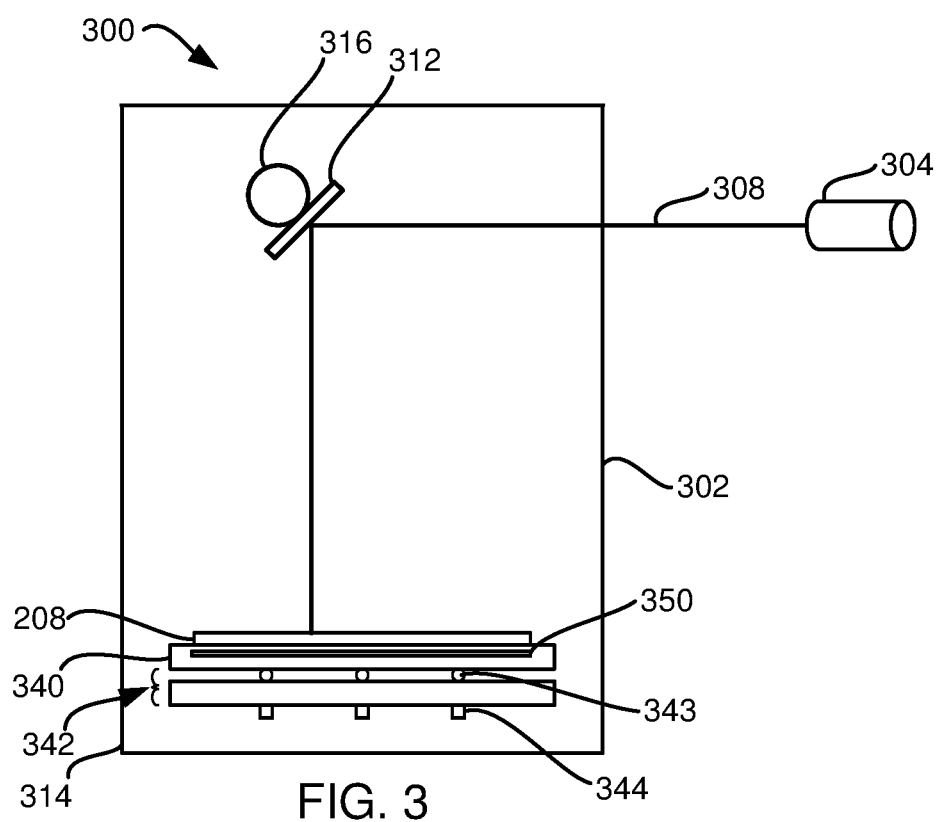
FIG. 3 is a schematic view of a localized heating system that may be used in an embodiment of the invention.

FIG. 3 is a schematic view of a excimer laser heating system 300 for providing the localized excimer laser heating of the ceramic layer 208 (step 112). The excimer laser heating system 300 comprises an excimer laser 304. The excimer laser 304 provides a pulsed laser beam 308 into a chamber 302. In some embodiments, the excimer laser 304 is within the chamber 302. In other embodiments the excimer laser 304 is outside of the chamber 302, where the pulsed laser beam 308 is directed into the chamber 302. The pulsed laser beam 308 is directed to a mirror 312. In this embodiment, the mirror is connected to a mirror actuator 316. The mirror 312 reflects the pulsed laser beam 308 toward the substrate 208.

A substrate support 340 is within the chamber 302. The substrate support 340 may be coupled to a two dimensional translation system 342 for independently moving the substrate support 340 in an x direction and a y direction. In this example, the translation system 342 comprises an x stage 343 for moving the substrate support 340 in the x direction and a y stage 344 for independently moving the substrate support 340 in the y direction. The two dimensional translation system 342 moves the substrate relative to the pulsed laser beam 308. The substrate support 340 may further comprise a heating element 350, such as for example, a resistive heater, and/or a heat sink such as a water cooled plate to control the substrate temperature during the process.

The substrate 204 with the ceramic layer 208 is placed in the excimer laser heating system 300 under a purge gas such as $N_2$, He, or Ar. A local region of the ceramic layer 208 is heated by the excimer laser 304 to a temperature that causes the ceramic layer to melt without damaging the substrate 204, where the melting reduces porosity and loose particles (step 112). The pulsed laser beam creates a beam field on the ceramic layer 208 with an area of 1-10 $mm^2$, so that the localized heating region directly heated by pulsed laser beam has an area of 1-10 $mm^2$.

The heated localized region of the ceramic layer 208 is scanned over the ceramic layer 208 (step 118). In various embodiments the two dimensional translation system 342 or the movement of the mirror 312 by the mirror actuator 316 either separately or in combination may be used to provide the scanning. In this embodiment, the scan is Cartesian forming rows and columns along the x and y directions. In other embodiments, the scan may be rotational in a spiral path. The local heating heats the ceramic layer 208 to the ceramic layer's 208 melting temperature causing the ceramic layer 208 to melt and resolidify. In some embodiment, the ceramic layer has been previously melted, so that the melting is a remelting. In this example, it is determined that the localized region will scan over the ceramic layer 208 twice (step 120). In this embodiment, the second scan would be at different processing conditions than the first scan. In other embodiments, the second scan would be at the same processing conditions.

Figure 2B:
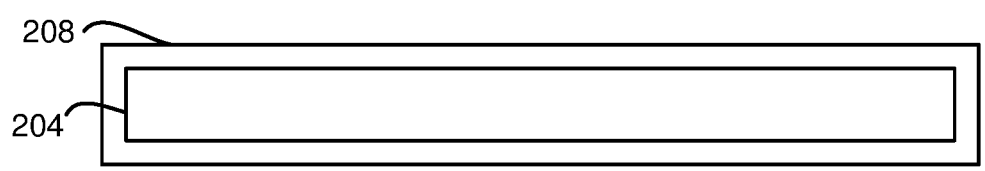

FIG. 2B is a schematic cross-sectional view of a substrate 204 with a ceramic layer 208 over the substrate 204 after the localized region has been scanned over the ceramic layer 208 twice. The process has reduced the porosity and surface particles, as indicated by the reduced shading. Other processing steps such as an additional deionized water rinse and a drying of the surface of the ceramic layer may be provided.

Figure 4:
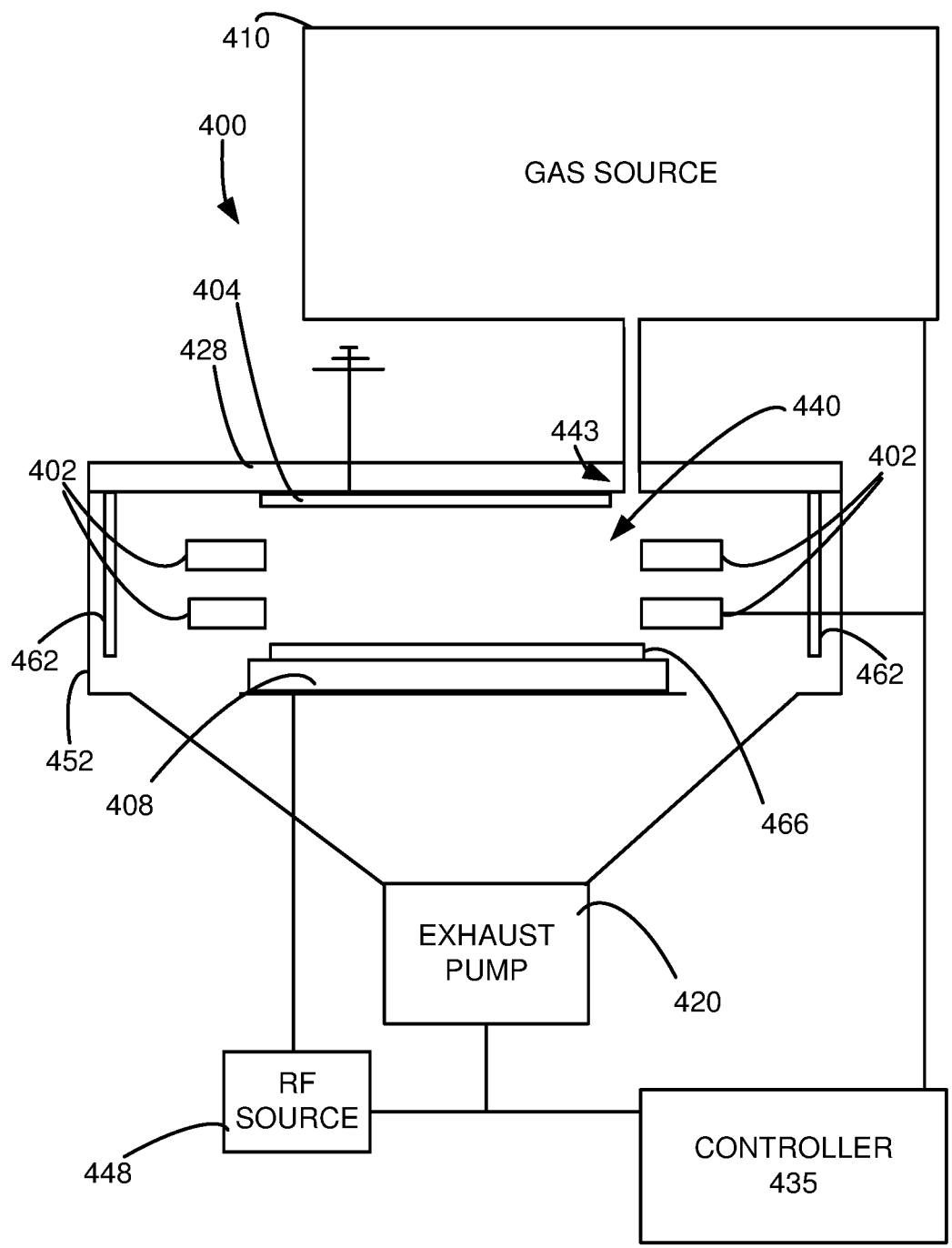
FIG. 4 is a schematic view of an etch reactor that may be used in an embodiment of the invention.

The substrate 204 is then made part of a plasma processing chamber (step 124). FIG. 4 is a schematic view of a plasma processing chamber 400 in which the substrate has been mounted. The plasma processing chamber 400 comprises confinement rings 402, an upper electrode 404, a lower electrode 408, a gas source 410, a liner 462, and an exhaust pump 420. The liner 462 is formed from the substrate with the remelted ceramic layer. Within plasma processing chamber 400, a wafer 466 is positioned upon the lower electrode 408. The lower electrode 408 incorporates a suitable substrate chucking mechanism (e.g., electrostatic, mechanical clamping, or the like) for holding the wafer 466. The reactor top 428 incorporates the upper electrode 404 disposed immediately opposite the lower electrode 408. The upper electrode 404, lower electrode 408, and confinement rings 402 define the confined plasma volume 440.

Gas is supplied to the confined plasma volume 440 through a gas inlet 443 by the gas source 410 and is exhausted from the confined plasma volume 440 through the confinement rings 402 and an exhaust port by the exhaust pump 420. Besides helping to exhaust the gas, the exhaust pump 420 helps to regulate pressure. An RF source 448 is electrically connected to the lower electrode 408.

Chamber walls 452 surround the liner 462, confinement rings 402, the upper electrode 404, and the lower electrode 408. The liner 462 helps prevent gas or plasma that passes through the confinement rings 402 from contacting the chamber walls 452. Different combinations of connecting RF power to the electrode are possible. In a preferred embodiment, the 27 MHz, 60 MHz and 2 MHz power sources make up the RF power source 448 connected to the lower electrode 408, and the upper electrode 404 is grounded. A controller 435 is controllably connected to the RF source 448, exhaust pump 420, and the gas source 410. The process chamber 400 may be a CCP (capacitive coupled plasma) reactor or an ICP (inductive coupled plasma) reactor or other sources like surface wave, microwave, or electron cyclotron resonance ECR may be used.

The substrate is then used in the plasma processing chamber (step 128). In use, the wafer 466 is placed on the lower electrode 408. Plasma processing gases such as etch gases or deposition gases are flowed from the gas source 410 into the plasma processing chamber 400. In this example the plasma processing gas has components comprising hydrogen and halogens. The plasma processing gas is formed into a plasma for plasma processing. Some of the halogen and hydrogen containing components deposit on the liner 462. When the chamber is opened, the hydrogen and halogen components form an acid with water vapor. With a high porosity, the ceramic layer would expose the substrate to the acid, which would cause the substrate to corrode. The heat treatment has reduced porosity, which improves the protection of the substrate by the ceramic layer from acid.

Preferably, porosity of the ceramic layer is greater than 5% before treatment and less than 1% after treatment. In another embodiment, the porosity of the ceramic layer is greater than 1% before treatment and less than 0.5% after treatment. In both cases, porosity is reduced by at least 50%. Preferably, the localized heating has a melt depth of less than 50 μm. More preferably, the melt depth is less than 30 μm. The low melt depth may prevent delamination of the ceramic layer from the substrate. This low melt depth allows for the ceramic to be melted to reflow the ceramic without damaging or melting the substrate. In some embodiment, material in the ceramic layer is melted for the first time. In other embodiments, material in the ceramic layer is remelted. In other embodiments, some of the material is melted for the first time while other material is remelted. In some embodiments the substrate is Al, anodized Al or alumina, and the locally heated region heats the ceramic layer to a temperature of at least 1800° C. Preferably, when a pulsed excimer laser beam is used the localized regions being melted have a diameter of less than 5 cm.

In some embodiments, the melted ceramic layer has improved particle performance, uniformity, density, purity, and surface finish to improve chemical and plasma resistance. The remelting may also be used to seal columnar grain boundaries of a PVD or CVD process. The remelting may also reduce coating pits and low density area aerosol deposition, increase coating hardness, and fracture toughness. In some embodiments, the ceramic layer is heated to a temperature above 2200° C. without damaging the underlying aluminum with a melting point of around 660° C. or alumina substrate, which has a much higher melting temperature.

The pulsed excimer laser has a frequency preferably in wavelength range of 157 to 351 nm. More preferably, the pulsed excimer laser has a wavelength in the range of 193 to 351 nm. The frequency of the pulsed laser beam from the excimer laser is chosen with respect to the ceramic layer, so that preferably less than 60% of the laser beam is transmitted through the ceramic layer across the thickness of the ceramic layer. More preferably, less than 50% of the laser beam is transmitted through the ceramic layer across the thickness of the ceramic layer. Preferably, the excimer laser is pulsed at repetition rate of 3-300 Hz. More preferably, the excimer laser provides a pulse at a pulse repetition rate of 25-200 Hz. Preferably, the area of the pulsed laser beam on the surface of the ceramic layer is between 0.01 mm$^2$ to 100 mm$^2$. More preferably the area of the pulsed laser beam on the surface of the ceramic layer is between 1 to 10 mm$^2$. The localized heating region of the ceramic layer heated by the pulsed laser beam is approximately equal to the area of the pulsed laser beam. The beam shape could be in the form of a square beam. When necessary, circular, rhomboid, Greek pi, or line beam shapes can be implemented to further enhance processing speeds. Preferably, the average laser energy density (fluence) of the pulsed laser beam is 200 to 8000 mJ/cm$^2$. More preferably, the average laser energy density of the pulsed laser beam is 500 to 3000 mJ/cm$^2$. Preferably, each region is pulsed 1 to 5000 times. More preferably, each region is exposed to 10 to 500 laser shots. Such exposure may be a static exposure that pulses the same area for a given number of pulses, and then moved to another non-overlapping area or the exposure may slowly move the area being irradiated between pulses to create overlapping pulsed regions, where the overlapping areas are irradiated a specified number of times. Such pulsing eliminates or reduces un-melted or dangling particles, cracks, and porosity. Such pulsing may also densify the ceramic layer, improve plasma erosion resistance, reduce particle formation, and improve the mechanical properties of the ceramic layer.

In another embodiment, instead of forming a ceramic layer over a substrate, the ceramic layer is reconditioned after use is a plasma processing chamber. The substrate and ceramic layer are removed from the plasma processing chamber. The surface of the ceramic layer is cleaned. In this example, the cleaning of the surface of the ceramic layer first provides a polishing of the surface of the ceramic layer. Such a polishing removes contamination, but also creates surface and subsurface damage to the ceramic layer. The surface of the ceramic layer is then subjected to an ultrasound treatment to provide ultrasonic shaking. The surface of the ceramic layer is then subjected to a deionized water rinse. The ceramic layer is then heated to 100° C. to dry the surface of the ceramic layer. The ceramic layer is then subjected to a pulsed excimer laser treatment to re-melt at least part of the ceramic layer. A subsequent deionized water rinse and dry may then be provided. In other embodiments, other cleaning steps such as scrubbing or chemical wiping may be provided. The reconditioned substrate is placed back into the plasma processing chamber, and the plasma processing chamber is used with the mounted reconditioned substrate.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for conditioning a ceramic layer comprising at least one of a fluoride, oxyfluoride, or oxide containing Lanthanide series group III or group IV elements with a thickness of less than 150 m over a substrate, comprising:
    cleaning the ceramic layer, wherein the cleaning the ceramic layer further comprises:
        rinsing the ceramic layer;
        applying ultrasonic energy to the ceramic layer; and
        drying the ceramic layer;
    scanning a region of the ceramic layer with a pulsed excimer laser beam at a repetition rate of 3-300 Hz and at a wavelength between 157 nm and 351 nm with an energy density of 200 to 8000 mJ/cm$^2$, wherein the region includes a plurality of points and each point in the region of the ceramic layer is treated with 10 to 500 laser shots, wherein the pulsed excimer laser beam provides localized heating of the region of the ceramic layer to a temperature that causes the region of the ceramic layer to melt without damaging or delaminating from the substrate, wherein a porosity of the ceramic layer is greater than about 1% and less than 4% before scanning and wherein scanning the region of the ceramic layer reduces porosity of the region of the ceramic layer by at least 50% to less than 0.5% after the scanning.

2. The method, as recited in claim 1, further comprising depositing the ceramic layer on the substrate.

3. The method, as recited in claim 2, wherein the depositing the ceramic layer comprises providing a thermal spray coating.

4. The method, as recited in claim 1, wherein the ceramic layer comprises at least one of yttrium oxide, yttrium fluoride, yttrium oxyfluoride, or yttria stabilized zirconia.

5. The method, as recited in claim 1, wherein the pulsed excimer laser beam has a wavelength that provides a transmittance of less than 60% over the thickness of the ceramic layer.

6. The method, as recited in claim 1, further comprising placing the substrate in a plasma processing chamber.

7. The method, as recited in claim 1, wherein the substrate is Al or anodized Al.

8. The method, as recited in claim 1, wherein the substrate is Al, anodized Al, or alumina and the melt depth is selected to prevent delamination of the ceramic layer from the substrate.

9. The method, as recited in claim 8, wherein the melt depth of less than 30 microns is selected.

10. The method, as recited in claim 1, further comprising repeating, at least once, the scanning to the region of the ceramic layer with a pulsed excimer laser beam at a repetition rate of 3-300 Hz.

11. The method, as recited in claim 1, wherein the scanning of the region of the ceramic layer with a pulsed excimer laser comprises remelting of the region of the ceramic layer with at least two exposures of varying energy levels.

\* \* \* \* \*